United States Patent [19]

Needham

[11] Patent Number: 5,583,786

[45] Date of Patent: Dec. 10, 1996

[54] APPARATUS AND METHOD FOR TESTING INTEGRATED CIRCUITS

[75] Inventor: Wayne Needham, Gilbert, Ariz.

[73] Assignee: Intel Corporation, Santa Clara, Calif.

[21] Appl. No.: 175,771

[22] Filed: Dec. 30, 1993

[51] Int. Cl.$^6$ .................................... G06F 17/50
[52] U.S. Cl. ................ 364/488; 371/22.1; 371/27
[58] Field of Search .................. 364/488–491, 364/578; 371/22.1, 22.3, 22.4, 22.5, 22.6, 23, 27

[56] References Cited

U.S. PATENT DOCUMENTS

| | | | |
|---|---|---|---|
| 3,643,156 | 2/1972 | Stewart et al. | 324/57 R |
| 3,927,371 | 12/1975 | Pomeranz et al. | 324/73 R |
| 4,433,413 | 2/1984 | Fasang | 371/25 |
| 4,519,078 | 5/1985 | Komonytsky | 371/25 |
| 4,594,711 | 6/1986 | Thatte | 371/25 |
| 4,597,080 | 6/1986 | Thatte et al. | 371/25 |
| 4,635,218 | 1/1987 | Widdoes, Jr. | 364/578 |
| 4,687,988 | 8/1987 | Eichelberger et al. | 324/73 AT |
| 4,688,222 | 8/1987 | Blum | 371/25 |
| 4,688,223 | 8/1987 | Motika et al. | 371/27 |
| 4,745,355 | 5/1988 | Eichelberger et al. | 324/73 R |
| 4,764,926 | 8/1988 | Knight et al. | 371/25 |
| 4,801,870 | 1/1989 | Eichelberger et al. | 324/73 R |
| 4,817,093 | 3/1989 | Jacobs et al. | 371/25 |
| 4,910,735 | 3/1990 | Yamashita | 371/22.4 |
| 5,027,355 | 6/1991 | Stoica | 371/22.1 |
| 5,051,997 | 9/1991 | Sakashita et al. | 371/22.4 |
| 5,084,874 | 1/1992 | Whetsel, Jr. | 371/22.3 |
| 5,101,409 | 3/1992 | Hack | 371/21.3 |
| 5,138,619 | 8/1992 | Fasang et al. | 371/21.1 |
| 5,187,712 | 2/1993 | Malleo-Roach et al. | 371/22.1 |
| 5,202,889 | 4/1993 | Aharon et al. | 371/27 |
| 5,253,255 | 10/1993 | Carbine | 371/22.6 |
| 5,260,946 | 11/1993 | Nunally | 371/22.1 |
| 5,301,199 | 4/1994 | Ikenaga et al. | 371/22.5 |
| 5,321,277 | 6/1994 | Sparks et al. | 257/48 |
| 5,329,533 | 7/1994 | Lin | 371/22.3 |
| 5,331,643 | 7/1994 | Smith | 371/22.3 |
| 5,369,648 | 11/1994 | Nelson | 371/27 |
| 5,416,783 | 5/1995 | Broseghini et al. | 371/22.3 |

OTHER PUBLICATIONS

Dahbura et al., "An Optimal Test Sequence for the JTAG/IEEE P1149.1 Test Access Port Controller," *1989 Int'l Test Conference*, Paper 3.2, pp. 55–62.

Landis, "A Self-Test Methodology for Restructurable WSI," *1990 Int'l Conference on Wafer Scale Integration*, pp. 258–264.

Li et al., "A Cost-Effective Scheme for At-Speed Self-Test," *IEEE TENCON* '93, pp. 89–92.

Vining, "Tradeoff Decisions Made for a P1149.1 Controller Design," *1989 Int'l Test Conference*, Paper 3.1, pp. 47–54.

Needham, Wayne M., "Designer's Guide to Testable ASIC Devices", published by Van Nostrand Reinhold, chapters 4 and 5, 1991.

Waicukauski, J. A., Lindbloom E., "Fault Detection Effectiveness of Weighted Random Patterns", IEEE International Test Conference, 1988, Paper 15.2, pp. 245–255.

*Primary Examiner*—Kevin J. Teska
*Assistant Examiner*—Leigh Marie Garbowski
*Attorney, Agent, or Firm*—Blakely, Sokoloff, Taylor & Zafman

[57] ABSTRACT

A testing methodology for very large scale integrated circuits, for example, microprocessors having several million transistors. Initially a set of pseudorandom test patterns is selected. During the design of the integrated circuit it is partitioned into functional units and each unit is designed to be verified and tested by the test patterns. During a test mode all of the units of the integrated circuit receives the test patterns in parallel. The output from each unit is coupled to a signature register. The contents of the signature registers are examined following application of the test pattern. This testing methodology lends itself to the simultaneous testing of many integrated circuits.

14 Claims, 3 Drawing Sheets

APPARATUS AND METHOD FOR TESTING INTEGRATED CIRCUITS

BACKGROUND OF THE INVENTION

1. Field of the Invention

The invention relates to the field of integrated circuit testing.

2. Prior Art

The testing of integrated circuits at the time they are manufactured and before they are incorporated into a larger assembly is very necessary. A microprocessor, for instance, should be carefully tested before it is incorporated into a computer not only to avoid a costly computer repair but also since it becomes more difficult to test the microprocessor after it is installed in a computer.

Several integrated circuit testing techniques are summarized in *Designer's Guide to Testable ASIC Devices*, by Wayne Needham, published by Van Nostrand Reinhold, Chapters 4 and 5. Also see U.S. Pat. Nos. 3,643,156; 3,927,371 and 4,635,218.

The vast majority of microprocessors as well as other integrated circuits are tested with a stored response tester. These testers contain a large memory that stores patterns of ones and zeros used as inputs to the microprocessor along with patterns of the correct outputs expected from the microprocessor. Patterns may be applied to a device under test (DUT) through the normally used input terminals or through special scan-in, scan-out ports. A subset of the test vectors used to verify the microprocessors design is often selected for this testing. By way of example, where a hundred million vectors are used to verify the integrated circuit's design, 10 million may be used for the testing of each microprocessor during manufacturing.

A microprocessor with three-or so million transistors is generally tested for 15–25 seconds after being manufactured by a stored response tester costing several million dollars. (Part of this testing is done by probing a wafer and part after the microprocessor has been packaged.) Consequently, many testers are required for a high volume integrated circuit and the cost of the testers is a significant part of the total capital cost required to fabricate some very large scale integrated circuits.

As the number of transistors in an integrated circuit increases, the required testing time also increases. For instance, for a microprocessor with six to seven million transistors, an estimated 30–45 seconds will be required again on a stored response tester costing several million dollars. Indeed, it is estimated that using current testing methodologies, the cost of testing a microprocessor with 10 million transistors, will equal or exceed the cost of producing the die (without packaging).

As will be seen, the present invention substantially reduces testing costs.

SUMMARY OF THE INVENTION

With the present invention, the testability of an integrated circuit is a consideration from the very beginning of the circuit's design. The integrated circuit is partitioned into functional units or blocks and each unit is designed to be tested by the same set of pseudorandom patterns. The patterns are selected as an initial step in the circuit's design and used throughout the design to verify the design; the patterns (or a subset) are later used for testing during manufacturing. Built into the integrated circuit is a test mode allowing each of the units to receive the test patterns in parallel. Each unit includes a multiple input signature register (MISR). During testing, the response of each of the units to each input pattern is hashed into its signature register. After completion of the test sequence, the contents of all the shift registers are serially read out on a standard P-1149.1 arrangement and compared with the correct register patterns.

Importantly, when the test patterns are sequentially applied during testing, the output of the device under test (DUT) is not monitored. For this reason, the test vectors can be simultaneously applied to many DUTs. Accordingly, not only are the units within each integrated circuit tested in parallel, many integrated circuits themselves are simultaneously tested. After application of the test patterns, examining the test results is a relatively fast process. For instance, where 400 bits are shifted out from each DUT and where a hundred DUTs are simultaneously tested, examination of the contents of all the signature registers takes only several seconds.

DETAILED DESCRIPTION OF THE PRESENT INVENTION

A testing method and apparatus is described for integrated circuits particularly useful for very large scale integrated circuits. In the following description, specific details such as a microprocessor having several specific units are set forth to provide a thorough understanding of the present invention. It will be obvious to one skilled in the art, however, that the present invention may be practiced without these specific details. In other instances, specific details concerning well-known testing practices and well-known circuits are not set forth in order not to unnecessarily obscure the present invention.

Methodology of the Present Invention

Figure 1:
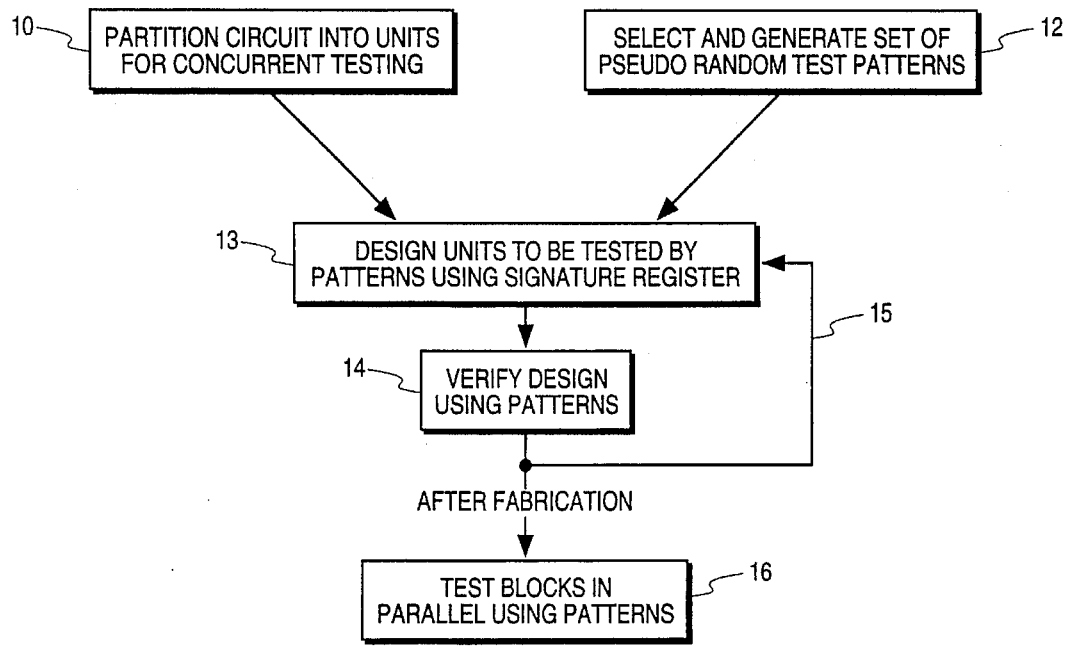
FIG. 1 is a flow chart illustrating on a high level the testing methodology of the present invention.

Referring to FIG. 1, two steps are shown on the same level to illustrate that they can concurrently occur. Step 12, discussed below comprises the establishing of pseudorandom test patterns. The other concurrent step, (step 10), is the partitioning of the integrated circuit into functional units, which units will be concurrently tested. To some extent this partitioning ordinarily occurs in the design of many integrated circuits. For example, a microprocessor is considered to include a plurality of functional units such as an instruction decoder, arithmetic logic unit, floating point unit, address translation unit, etc. These units lend themselves to being tested in parallel as provided by the present invention.

There may be, however, some functional units within a particular integrated circuit that do not lend themselves to testing as provided by the present invention. For instance, a programmable logic array (PLA) may not be well exercised with pseudorandom patterns and consequently, this unit of an integrated circuit may require other testing. In the case of a RAMs, well-known built in self test (BIST) may be used or special test patterns may be required to test a RAM or other units that are not testable by pseudorandom patterns.

An initial step in the practice of the present invention is to establish a set of pseudorandom test patterns that are used both for verifying the design of the integrated circuit and for the testing that occurs during manufacturing. For a complex microprocessor, by way of example, four billion test patterns may be used. Several groups of test patterns are selected, such as a group having a high percentage of ones, a group having a high percentage of zeros, a group having heavy transitions, a group having transitions only in certain fields, a group having shifting or walking patterns, etc. It is not necessary for the patterns to be stored since each group of the patterns may be generated using an algorithm. The important thing is that the sequence of the pseudorandom patterns be reproducible. Step 12 of FIG. 1 illustrates the selection and generation of these test patterns.

As each unit of the integrated circuit is designed to perform its function within the integrated circuit, it is concurrently designed to be tested by the patterns selected by step 12. What this requires is that each unit function deterministically when stimulated by the patterns and moreover, that each unit be fully exercised by the patterns. Circuit elements added to assure testability by the patterns, for instance, to prevent blocking that can occur following an illegal state in a state machine, are discussed in conjunction with FIGS. 7 and 8.

As each of the units is designed in step 13, its design is verified using the test patterns as shown by step 14. This will typically require part of each unit to be redesigned, as shown by the line 15, to assure that the design is verifiable and testable by the patterns.

A signature register is designed into each unit so that the outputs of a unit may be combined and stored, as will be discussed.

It should be kept in mind that the verifying and testing is done with each of the units taken alone, that is, without inputs from the other units. This is in contrast to the normal operation of the units where inputs from other units are needed for a functional integrated circuit. Thus, during verification and testing, patterns are provided to all inputs of a unit even if this requires the generation of additional patterns within the integrated circuit as will be described.

After the design is completed and the fabrication of the integrated circuit begins, the functional units in the integrated circuit are tested in parallel using the patterns as shown by step 16. Typically, the entire set of patterns used for design verification is not used for testing after manufacturing but rather some subset (e.g., one billion of four billion patterns may be used for testing).

INCORPORATION OF THE PRESENT INVENTION INTO A MICROPROCESSOR

Figure 2:
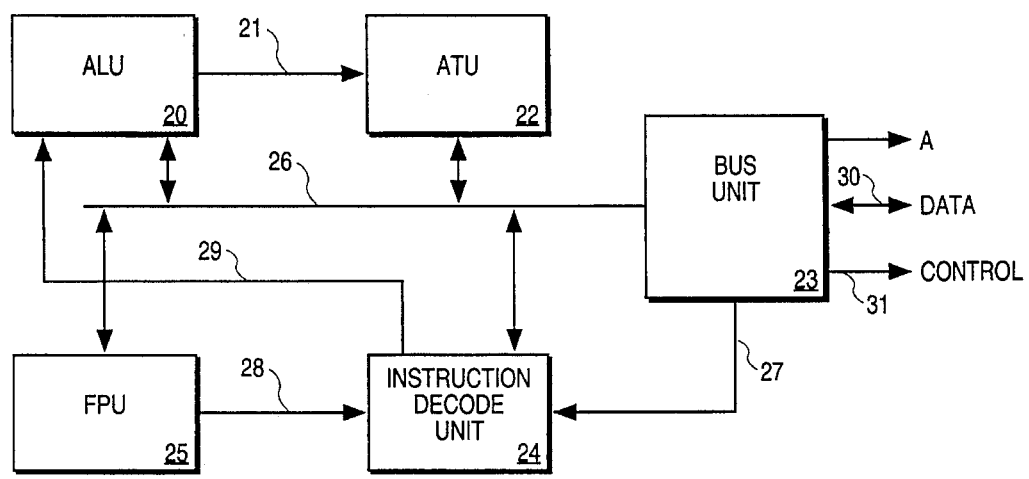
FIG. 2 is a block diagram illustrating a prior art microprocessor.

Referring now to FIG. 2, a prior art integrated circuit microprocessor having an arithmatic logic unit (ALU) 20, an address translation unit (ATU) 22, a floating point unit (FPU) 25, an instruction decode unit 24 and a bus unit 23 is shown. The bus unit 23 communicates with the ALU, ATU, FPU and decode unit through a bus 26. Bus 26 typically comprises a plurality of lines, some for receiving outputs from the bus unit and others for providing inputs to the bus unit. Additionally, other coupling between the units is illustrated such as bus 27 which, by way of illustration, may communicate instructions directly from the bus unit to the decode unit 24 and buses 28 and 29 which may carry signals representing decoded instructions to the FPU 25 and ALU 20, respectively. Another path comprising bus 21 is shown between the ALU 20 and the ATU 22 which, for instance, may transmit virtual addresses and control signals. The bus unit 23 provides coupling to external lines such as address lines, I/O data lines 30, and control lines 31.

The microprocessor of FIG. 2 is partitioned into functional units as shown by step 12 of FIG. 1. Partitioning into functional units, other than that shown in FIG. 2 may be employed. For instance, if the decode unit 24 includes a PLA, it may be considered as a separate unit and, as mentioned earlier, tested separately with BIST. Moreover, the microprocessor of FIG. 2 is shown to assist in describing the present invention. The microprocessor could have other units such as a cache memory and numerous other connections other than those shown. Other integrated circuits would similarly be divided into functional units to practice the present invention.

Figure 3:
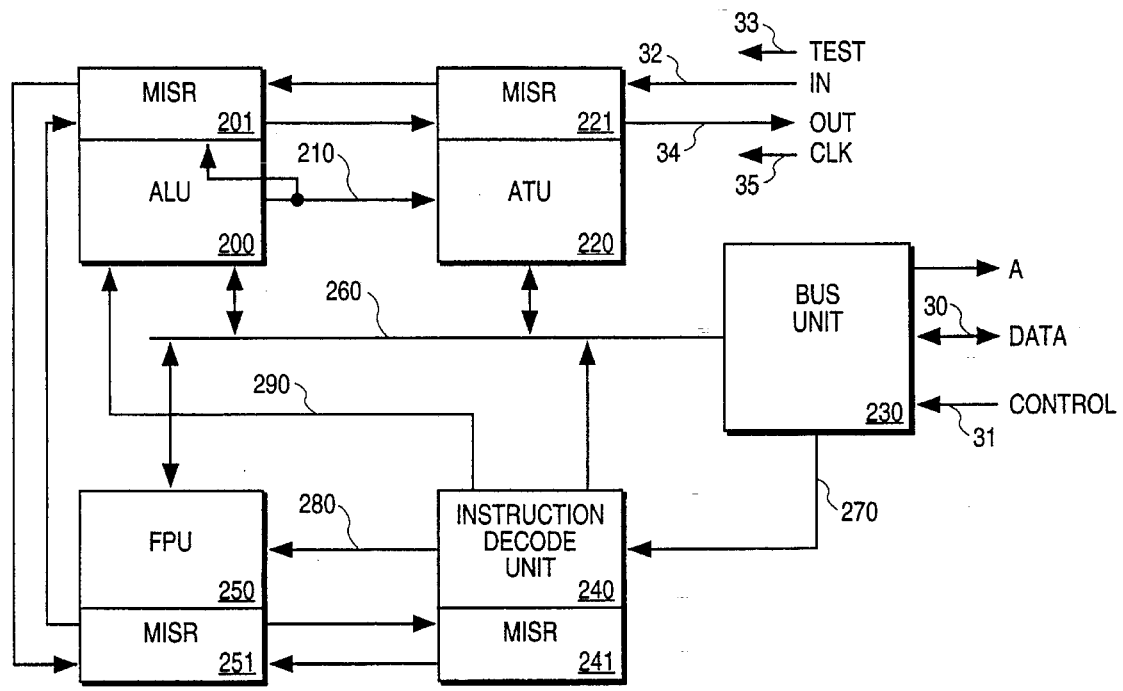
FIG. 3 is a block diagram showing the microprocessor of FIG. 2 with the improvement of the present invention. The interconnections between the units of the microprocessor in FIG. 3 are for normal (non-testing) operation of the microprocessor.

Referring now to FIG. 3, the microprocessor of FIG. 2 is again illustrated, this time however, with the improvement of the present invention. Each of the units of FIG. 2 are again shown in FIG. 3. The ALU 20 of FIG. 2 is shown as ALU 200 in FIG. 3. ALU 200, when designed in accordance with the present invention, will not typically be identical to the ALU 20 of FIG. 2 since certain logic will be added to permit verification and testing by the pseudorandom patterns, as mentioned. The same applies to the other units in FIG. 3.

A multiple input signature register (MISR) is coupled to each of the units that are to be tested in accordance with the present invention. Thus, as shown in FIG. 3, the ALU 200 is coupled to MISR 201, ATU 220 to MISR 221, FPU 250 to MISR 251 and the instruction decode unit 240 to MISR 241. Each MISR, as known in the prior art, includes a shift register which can serially shift in and shift out data. The MISRs are connected in series to test access terminals 32 and 34 of the microprocessor. These ports in the currently preferred embodiment are standard test access ports such as specified by IEEE P-1149.1.

A signal to activate the shifting in the shift registers is coupled to line 33 and a clock signal for timing the shifting is coupled to line 35. With the arrangement shown in FIG. 3, a predetermined pattern, such as all zeros, can be shifted into the MISRs at the beginning of testing from line 32. After the testing is completed the patterns remaining in the MISRs are shifted out (serially) on line 34 so that the contents of each of the MISRs can be examined.

As will be seen, each MISR has ports for receiving parallel inputs. Each MISR will generally have a different number of inputs. The number of inputs will correspond to the number of outputs from its respective unit. For instance, if ATU 220 under normal operation provides 30 outputs onto the bus 260, MISR 221 will have 30 inputs.

In some cases, a particular unit may have a very large number of outputs. Some outputs may be combined with other outputs to reduce the number of stages required in an MISR. For example, two outputs from a unit may be exclusively ORed to reduce the number of stages required by one.

No MISR is coupled to the bus unit 230. This unit is functionally tested since all the test patterns from buses 30 and 31 are coupled through this unit to the other units during testing. Moreover, special patterns or other tests may be used for certain units such as bus units or other input/output units.

The interconnections between the units shown in FIG. 3 is the same as that of FIG. 2. This interconnection is that used by the microprocessor for its normal (non-testing) operation. Therefore, instructions may be coupled from the bus unit 230 through bus 270 to the instruction decode unit 240 and decoded signals provided through buses 280 and 290 to units 250 and 200, respectively. During normal operation, the microprocessor operates the same as the microprocessor of FIG. 2. As mentioned, there may be some additional circuits, but these do not change the overall function of the units. Another difference between the units of FIGS. 2 and 3 is that the outputs from each of the units (except unit 230) in addition to being coupled to another unit is also coupled to a MISR. By way of illustration, the outputs from ALU 200 during normal operation are coupled on bus 210 to the ATU 220 and to MISR 201. During normal operation the inputs to the MISRs are not used.

Figure 4:
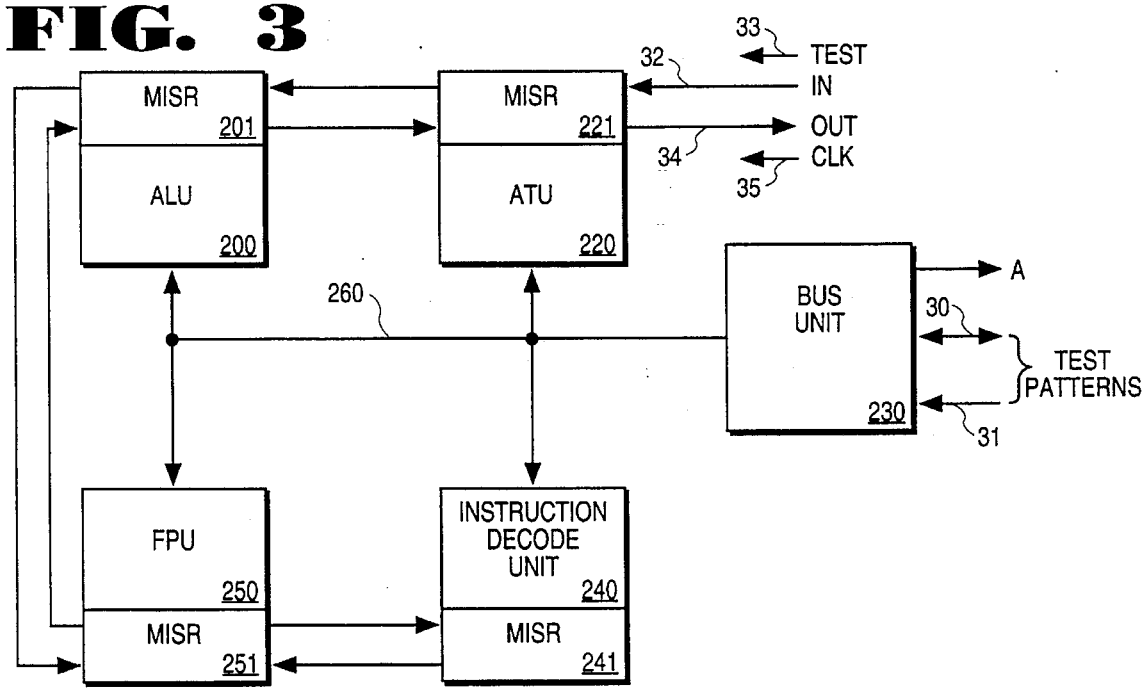
FIG. 4 again is a block diagram of the microprocessor of FIG. 2 with the improvement of the present invention. This time, however, the connections between the functional units of the microprocessor are those used for testing.

FIG. 4 illustrates the microprocessor of FIG. 3 during testing in accordance with the present invention. Upon application of a test mode signal (a different signal than the signal on 33), the coupling between the units shown in FIG. 3 is changed to the arrangement shown in FIG. 4. In FIG. 4 the ALU 200, ATU 220, FPU 250 and decode unit 240 are coupled to the bus unit 230 so that each of the units receives in parallel the test patterns applied to bus 30 and lines 31.

FPU 250 during normal operation is coupled to receive inputs from all of the lines of bus 30 and two of the lines from control lines 31. During testing, as shown in FIG. 4, FPU 250 will receive from the bus unit, the test patterns applied inputs from all of the lines within bus 30 and the two lines of the control lines 31 to which the FPU 250 is coupled during normal operation. Again, assume that the ATU 220 during normal operation receives inputs from all of the lines in the bus 30 and three of the control lines of lines 31, then, during testing as shown in FIG. 4, it will receive the test pattern inputs applied to these lines. As will be discussed in more detail in conjunction with FIG. 6, the inputs that, for instance, are normally received by FPU 250 from the unit 240 over bus 280 of FIG. 3 are provided from the test pattern either directly or by combining test pattern signals to provide additional signals.

An overview of the testing that occurs in the present invention can be readily seen from FIG. 4. First the test mode signal is applied to the microprocessor to put it into the test mode and provide the connections shown in FIG. 4. By application of the MISRs test signal and a clocking signal to lines 33 and 35, respectively, inputs to all of the signature registers is serially clocked into MISRs 201, 221, 251 and 241. This places the shift registers in a predetermined state, for example, all zeros. Generally, some predetermined patterns are now applied to place all non-combinatorial circuits (e.g., state machine, registers) into known states. Now the test patterns are applied to the bus 30 and lines 31 along with whatever clock signals the microprocessor uses. The test patterns inputs are simultaneously applied to the units 200, 220, 240 and 250. For each input, each of the units produces an output which is coupled to its respective signature register. The signals coupled to the signature registers are hashed together with linear feedback as will be described to prevent the masking of multiple errors. After all the test patterns have been coupled to the units, the contents of the signature registers are clocked out and examined. These patterns are compared with the known correct pattern to determine if the microprocessor is defect free. (During the design process, typically each unit is simulated; the test patterns are used to stimulate the simulation. When this occurs, the outputs from each unit are known, also the contents of its respective signature register are also known. Accordingly, the correct pattern for each of the signature registers is determined.)

ALU AND ITS SIGNATURE REGISTER

Figure 6:
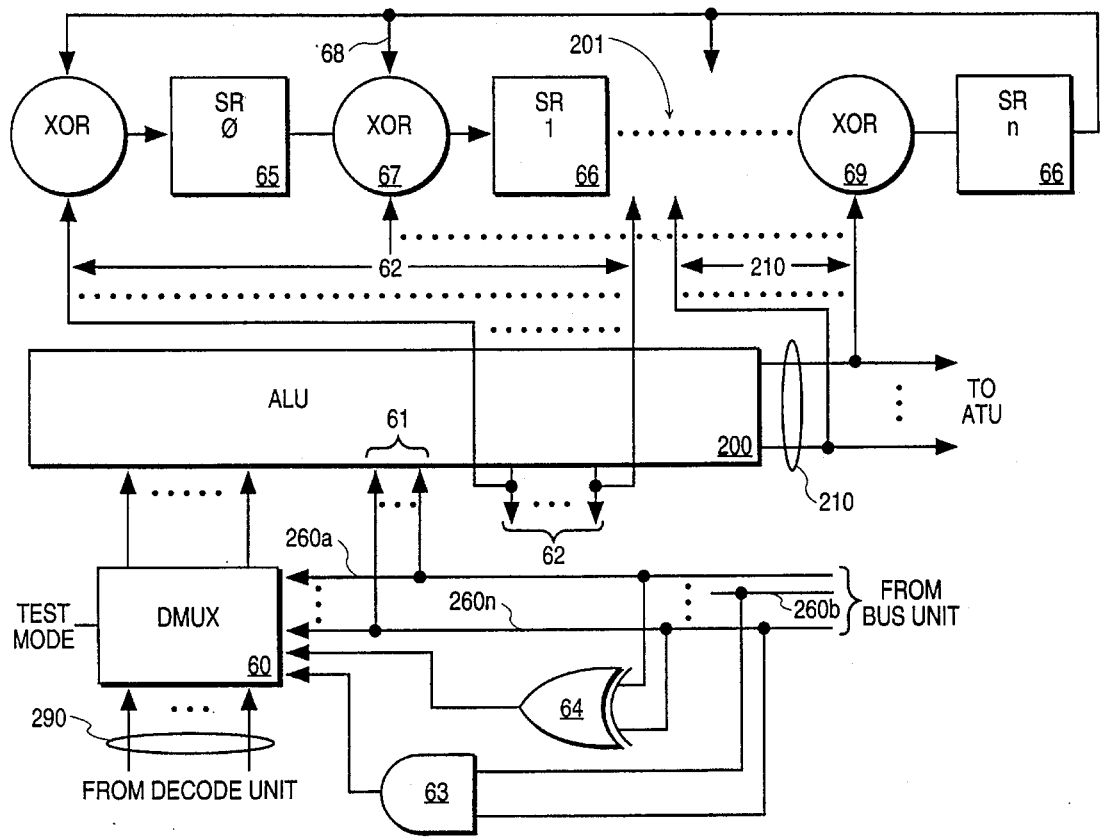
FIG. 6 illustrates one functional unit of the microprocessor of FIG. 2 with the improvement of the present invention including the signature register.

In FIG. 6, the ALU 200 of FIGS. 3 and 4 is shown along with its associated signature register 201 and other circuitry used with the present invention. During normal operation, as shown in FIG. 3, the ALU receives inputs from the bus 260 and provides outputs to the bus 260. This is shown in FIG. 2 as the input lines 61 and output lines 62. Also, as shown in FIG. 3 the ALU 200 receives inputs from bus 290. The bus 290 is again shown in FIG. 6 coupled to a demultiplexor (DMUX) 60. The output of the DMUX 60 is coupled to provide inputs to the ALU 200. The bus 210 coupling the ALU 200 to the ATU 220 is again shown in FIG. 6.

First, it should be noted from FIG. 6, that all the outputs from the ALU 200, specifically, lines 62 and bus 210 are coupled to the signature register 201. Lines 62, in addition to providing output to bus 260 of FIG. 3, provides inputs to register 201. These inputs are shown connected to XOR gates of the register 201. Similarly, bus 210, in addition to being coupled to the ATU 210 provides inputs to the register 201. Again, each line of bus 210 is coupled to an XOR gate of the signature register. Accordingly, for the embodiment shown, there is one input to the signature register 201 for every output of the ALU 200.

During normal operation of the ALU 200, the signals from the bus 290 simply pass through the DMUX 60 to the ALU. When testing begins, the test mode signal is applied to the DMUX 60 causing bus 290 to be decoupled and causing inputs from the bus unit 230 to be coupled into the ALU 200. Similarly, there is a DMUX which decouples bus 210 from the ATU 220 and other DMUXs to provide the coupling of FIG. 4.

Note that the inputs to the ALU 200 from bus 290 are not from the bus unit during normal operation. For this reason, during testing other inputs must be used that are directly related to the test patterns. In some cases, the input patterns after passing through the bus unit are directly coupled to the DMUX 60 such as shown by line 260a through 260n. Another input to the ALU 200 during testing is obtained by exclusively ORing the signal on line 260a with the signal on 260n with the gate 64. Yet another input to the ALU during testing is the signal on line 260b ANDed by gate 63 with the signal on line 260n. The inputs provided to ALU 200 during testing through the DMUX 60 will always be a direct function of the particular test pattern applied to the integrated circuit since the signals on bus 260 are the test patterns applied to bus 30 and lines 31.

The multiple input signature register 201 includes a plurality of stages, such as state 65 and 66, each separated by an exclusive OR gate. The inputs to the register (outputs of the ALU 200) are each coupled to one gate. Another input to each gate is the one or zero stored in the preceding stage. Some gates have a third input, the bit stored in the last state of the register. The output of each gate is stored in its respective stage. For instance, the output of gate 67 is stored in stage 66 (SRI).

Some of the exclusive OR gates receive feedback such as shown for gate 67 through line 68 and others do not receive feedback such as shown gate 69. This selective feedback is used to implement a polynomial as known in the prior art. This reduces the probability of one error masking another error and thereby making the contents of the signature register appear to be correct when, in fact, its apparent correctness is due to multiple errors. A discussion on the probability of fault coverage and other properties of MISRs is found in "Aliasing Properties of Circular MISRs" by Edirisooriya and Robinson, *Journal of Electronic Testing Theory and Application* (JETTA), Vol. 4, No. 2, May 1993, Kluwer Academic Publishers, pp. 151–157.

While not shown in FIG. 6, the contents of the stages of the register can be shifted out serially for purposes of reading the contents of a register as previously discussed. Also, data can be shifted in for purposes of initializing the register.

BUILDING IN TESTABILITY

Figure 7:
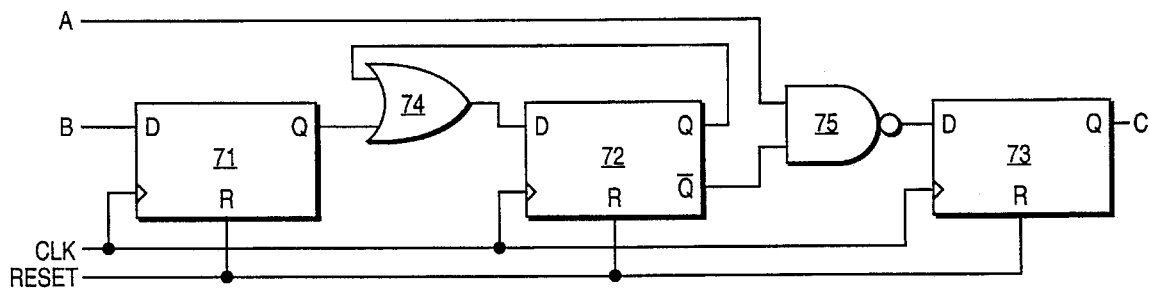
FIG. 7 is an electrical schematic used to illustrate how the testing methodology of the present invention is built into the initial design of the integrated circuit.
Figure 8:
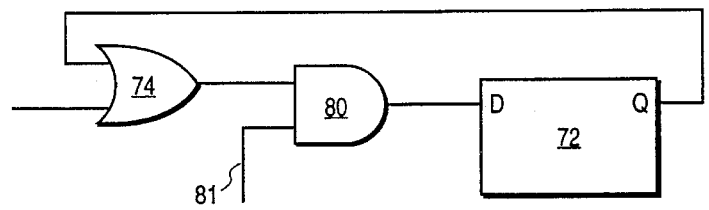
FIG. 8 is an electrical schematic illustrating an alternate approach to the one shown in FIG. 7 for building-in the testing methodology of the present invention.

As mentioned above, when the circuitry used in the integrated circuit is designed, it should be designed so that the pseudorandom patterns are able to verify the design and test the circuitry. In FIGS. 7 and 8 an example of how this is done is shown. Consider a state machine which has four flip-flops (16 possible states). Assume seven of the states are illegal. The pseudorandom patterns may cause the state machine to assume an illegal state and thereby block the testing of circuitry controlled by the state machine.

In FIG. 7, three D flip-flops 71, 72 and 73 are illustrated. The Q output of the flip-flop 71 is coupled to the D input of flip-flop 72 through an OR gate 74. The Q output of flip-flop 72 is also coupled to the input of this OR gate. The $\overline{Q}$ output of flip-flop 72 is coupled to the NAND gate 75; an input "A" is also coupled to this gate. A "B" input signal is coupled to the D terminal of the flip-flop 71. Assume the "C" signal (Q terminal of the flip-flop 73) drives other circuitry in the microprocessor.

A high output from gate 74 will cause the Q output of the flip-flop 72 to be high. When this occurs, flip-flop 72 will always have its Q terminal high. Then the $\overline{Q}$ terminal of 72 is low and this low signal is applied to one input of the NAND gate 75. Under these conditions the output of the NAND gate 75 will always be high, no matter what the A input is. This causes the C signal to remain constant and any circuitry driven by the C signal will not be exercised. With the pseudorandom patterns this blocking can occur with perhaps the very first few test patterns and thereafter cause blocking which prevents exercising of the circuitry driven by the C signal.

This blocking can be easily avoided by simply periodically resetting the flip-flops during testing. For example, a circuit can reset the flip-flops every, for example, 50 test patterns thereby assuring a C signal.

This is but one example of designing the unit's of the integrated circuit so that they can be verified and tested by the pseudorandom patterns. Others will be apparent to one skilled in the art.

FIG. 8 is an alternate approach to prevent the blocking shown in FIG. 7. In FIG. 8 the flip-flop 72 and OR gate 74 of FIG. 7 are again shown. However, this time the output of the OR gate 74 is coupled to the D terminal of flip-flop 72 through an AND gate 80. The other input to the AND gate 80, line 81, is maintained high thereby allowing the output of the AND gate 80 to pass to flip-flop 72 during normal operation. During testing, however, line 81 can be periodically brought low to free the flip-flop 72 from its own output. Again, this can be done, by way of example, with every tenth input pattern.

SIMULTANEOUS TESTING OF ICS

Figure 5:
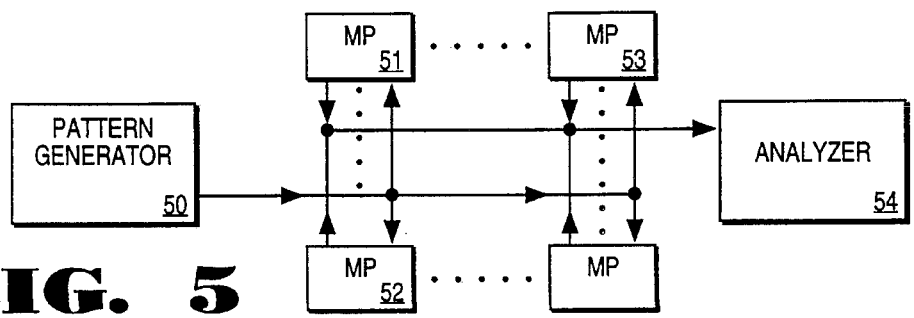
FIG. 5 illustrates testing in accordance with the present invention where a plurality of microprocessors are simultaneously tested.

Once an integrated circuit is fabricated, as provided by present invention, it may be simultaneously tested as shown in FIG. 5, with other like integrated circuits. FIG. 5 shows a plurality of presumably identical microprocessors, such as microprocessors 51, 52 and 53 coupled to receive test patterns from pattern generator 50. While not shown, the pattern generator or other means can be used to provide power to the microprocessors under test, clocking signals, test mode signal, special patterns for initializing the microprocessors and MISRs to predetermined states, and special test patterns needed, for example, to test a PLA. After this initialization and preliminary testing the microprocessors simultaneously receive the sequence of pseudorandom test patterns. After the test patterns have been applied to the microprocessors, the data stored in the signature registers from each of the microprocessors is compared by the analyzer 54 with the correct test patterns. This testing process allows the immediate identification of those microprocessors which failed the test since the defective microprocessors will not contain the correct data pattern in their signature registers.

Thus, a testing methodology has been described which is particularly useful for very large scale integrated circuits.

I claim:

1. A method for designing an integrated circuit comprising the steps of:

partitioning a portion of the circuit into functional units;

selecting a set of pseudorandom test patterns;

designing the units such that each unit can be tested by the pseudorandom patterns;

providing each of the units with a memory;

providing a test mode on the integrated circuit for simultaneously coupling the test patterns to the units and for causing the units to generate outputs in response to the test patterns;

coupling the outputs of each unit to the memory of each unit; and providing a mechanism for reading data from the memory.

2. The method of claim 1 wherein the step of designing the units includes verifying the design of the units with the test patterns prior to fabrication of the integrated circuit.

3. An integrated circuit comprising:

a plurality of functional units, each unit including a signature register for recording the response of the unit to input signals;

a bus for receiving a predetermined set of test patterns and for coupling in parallel the test patterns to each unit;

each unit being adapted to respond to the same set of predetermined test patterns when the set is applied as input signals to the unit; and a test mechanism for reading the contents of the signature registers.

4. The integrated circuit defined by claim 3 wherein the bus is adapted for receiving the test patterns and for coupling in parallel the test patterns to the units upon the application of a test mode signal to the integrated circuit.

5. The integrated circuit defined by claim 4 wherein the signature registers are coupled in series to a terminal on the integrated circuit for reading the contents of the signature registers at the terminal.

6. The integrated circuit defined by claim 5 wherein each of the signature registers includes linear feedback.

7. The integrated circuit of claim 6 wherein the test patterns are pseudorandom.

8. A method for providing testability for an integrated circuit comprising the steps of:

selecting a set of pseudorandom test patterns each pattern comprising a plurality of bits;

partitioning part of the integrated circuit into a plurality of functional units;

assuring that each of the functional units is testable by the test patterns;

applying the test patterns to the integrated circuit such that each unit receives some of the bits of each pattern;

storing signals representing the response of each of the units to the bits; and, examining the stored signals representing the responses.

9. The method defined by claim 8 wherein the step of applying the test patterns includes the generation of the test patterns by an algorithm.

10. The method defined by claim 9 wherein the step of storing signals includes storing in signature registers.

11. In an integrated circuit that includes a plurality of multiple input signature registers for storing responses to input test patterns, an improved method for testing the integrated circuit comprising the steps of:

partitioning a portion of the integrated circuit into functional units, each functional unit being coupled to a signature register for providing its outputs thereto;

assuring that each of the units is testable by a set of test patterns;

simultaneously applying the set of test patterns to the units and in response storing the outputs of each unit to its respective signature register; and, examining the contents of the signature registers after the test patterns have been applied to the units.

12. The method defined by claim 11 wherein the set of test patterns are pseudorandom.

13. The method defined by claim 12 wherein the pseudorandom patterns are generated by an algorithm.

14. In an integrated circuit having a plurality of functional units, an improvement of the integrated circuit for testing the circuit comprising:

a bus for directing input test patterns applied to the circuit to each of the units when a test mode is selected;

each of the units being coupled to receive the input test patterns from the bus and to process the test patterns to provide output signals;

a storage means for each of the units, for receiving the output signals from its respective unit, the storage means providing a test signature for its respective unit; and, read out means coupled to the storage means for reading out the test signatures from each of the units.

* * * * *